United States Patent
Wu et al.

(10) Patent No.: US 10,236,069 B2
(45) Date of Patent: Mar. 19, 2019

(54) WORD LINE READ DISTURB ERROR REDUCTION THROUGH FINE GRAINED ACCESS COUNTER MECHANISM

(71) Applicant: Intel Corporation, Santa Clara, CA (US)

(72) Inventors: Ning Wu, Folsom, CA (US); Robert E. Frickey, Sacramento, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/627,928

(22) Filed: Jun. 20, 2017

(65) Prior Publication Data
US 2018/0366204 A1 Dec. 20, 2018

(51) Int. Cl.
*G11C 16/34* (2006.01)
*G11C 16/04* (2006.01)
*G11C 11/56* (2006.01)
*G11C 11/34* (2006.01)

(52) U.S. Cl.
CPC ...... *G11C 16/3427* (2013.01); *G11C 16/0483* (2013.01); *G11C 11/34* (2013.01); *G11C 11/5642* (2013.01)

(58) Field of Classification Search
CPC ............ G11C 16/3427; G11C 16/0483; G11C 11/5642; G11C 11/34
USPC .............................................. 365/185.02, 200
See application file for complete search history.

(56) References Cited

U.S. PATENT DOCUMENTS

| | | | |
|---|---|---|---|
| 6,405,323 B1 * | 6/2002 | Lin | G06F 3/0619 711/152 |
| 6,427,186 B1 * | 7/2002 | Lin | G06F 12/0246 711/103 |
| 8,332,578 B2 | 12/2012 | Frickey, III et al. | |
| 8,954,650 B2 | 2/2015 | Belgal et al. | |
| 9,354,973 B2 | 5/2016 | Wakchaure et al. | |
| 9,842,660 B1 * | 12/2017 | Karamcheti | G11C 29/04 |
| 2008/0320214 A1 * | 12/2008 | Ma | G06F 3/0613 711/103 |
| 2009/0077903 A1 * | 3/2009 | Madesh | A47C 11/00 52/36.4 |
| 2010/0017650 A1 * | 1/2010 | Chin | G06F 11/108 714/6.12 |
| 2012/0239990 A1 * | 9/2012 | Mataya | G06F 12/0866 714/704 |
| 2013/0262748 A1 * | 10/2013 | Chang | G06F 12/145 711/103 |
| 2013/0262749 A1 * | 10/2013 | Oikawa | G06F 11/004 711/103 |
| 2014/0136884 A1 * | 5/2014 | Werner | G06F 11/2094 714/6.11 |
| 2014/0281121 A1 * | 9/2014 | Karamcheti | G06F 3/061 711/102 |
| 2015/0169405 A1 | 6/2015 | Frickey, III et al. | |

(Continued)

*Primary Examiner* — Viet Q Nguyen
(74) *Attorney, Agent, or Firm* — Compass IP Law PC

(57) ABSTRACT

An apparatus is described. The apparatus includes a storage device having multiple non volatile memory chips and controller circuitry. The controller circuitry is to implement wear leveling of storage cells of the non volatile memory chips at a granularity of segments of storage cell arrays of the non volatile memory chips that share a same disturber node and that are coupled to a same storage cell array wire to diminish disturb errors.

12 Claims, 11 Drawing Sheets

Maintaining access counts to segments of storage cell arrays of non volatile memory chips of a solid state storage device that share a same disturber node and that are coupled to a same storage cell array wire 701

Determining that a wear leveling threshold has been crossed for one of the segments 702

Causing data stored in one of the segments to be swapped out of the one of the segments to diminish disturb errors attributable to the one of the segments 703

(56) References Cited

U.S. PATENT DOCUMENTS

| | | | |
|---|---|---|---|
| 2015/0262714 A1* | 9/2015 | Tuers | G11C 29/50004 |
| | | | 714/721 |
| 2016/0077903 A1* | 3/2016 | Reddy | G11C 16/349 |
| | | | 714/704 |
| 2016/0283119 A1 | 9/2016 | Frickey, III et al. | |
| 2016/0314849 A1* | 10/2016 | Chang | G11C 16/3427 |

* cited by examiner

| Die 0 | Block ID = 300 | ... | 2985 | ... |
| Die 1 | Block ID = 300 | ... | 2985 | ... |
| Die 2 | Block ID = 300 | ... | 2985 | ... |
| Die 3 | Block ID = 300 | ... | 2985 | ... |

401

| Block 300 | SGS-WL ID = 00 | 11,940 |
| | SGS-WL ID = 01 | 1 |
| | ... | ... |
| | SGS-WL ID = 15 | 1 |

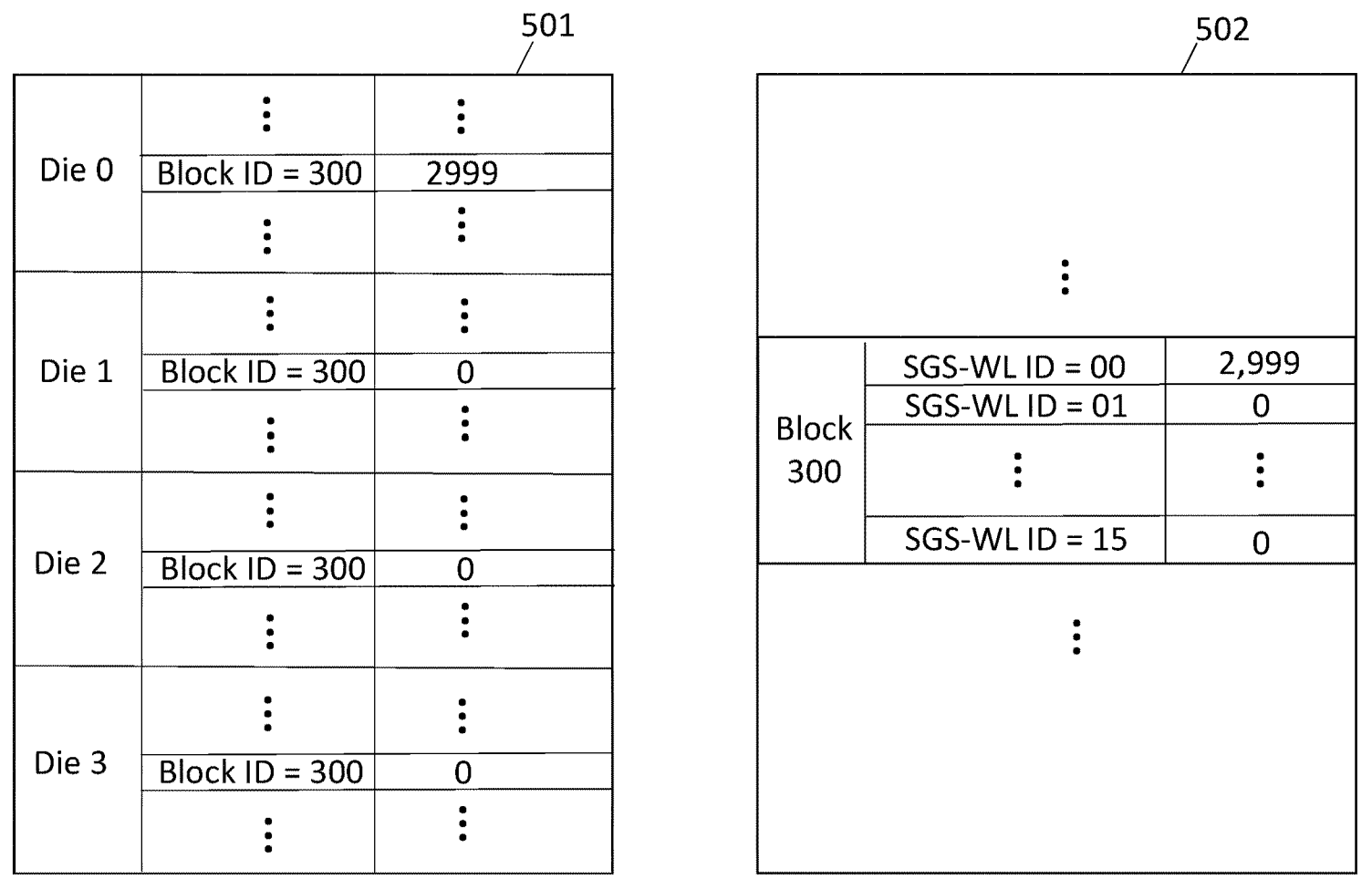

| | | 502 |
|---|---|---|
| Block 300 | SGS-WL ID = 00 | 2,999 |
| | SGS-WL ID = 01 | 0 |
| | ... | ... |
| | SGS-WL ID = 15 | 0 |

| | | 501 |
|---|---|---|
| Die 0 | Block ID = 300 | 2999 |
| Die 1 | Block ID = 300 | 0 |
| Die 2 | Block ID = 300 | 0 |
| Die 3 | Block ID = 300 | 0 |

Fig. 5

| Block 300 | |
|---|---|
| SGS-WL ID = 00 | 5,998 |
| SGS-WL ID = 01 | 0 |
| ... | ... |
| SGS-WL ID = 15 | 0 |

502

| | | |
|---|---|---|
| Die 0 | Block ID = 300 ... | ... 2,999 |
| Die 1 | Block ID = 300 ... | ... 2,999 |
| Die 2 | Block ID = 300 ... | ... 0 |
| Die 3 | Block ID = 300 ... | ... 0 |

WORD LINE READ DISTURB ERROR REDUCTION THROUGH FINE GRAINED ACCESS COUNTER MECHANISM

FIELD OF INVENTION

The field of invention pertains generally to the computing sciences and, more specifically, to word line read disturb error reduction through fine grained access counter mechanism.

BACKGROUND

As the storage densities of mass storage devices continues to increase, both data corruption error mechanisms and the manner of trying to avoid them are becoming increasingly complex. An increasingly problematic data corruption mechanism for high density non volatile memory devices, such as FLASH memory devices, is that too many accesses to a particular memory cell can potentially corrupt data stored in nearby memory cells. For example, FLASH memory devices exhibit a word line read disturb error mechanism. In the case of the word line read disturb error mechanism data kept by storage cells that are proximate to a cell being frequently accessed for read operations may become corrupted on account of the signaling being frequently applied to the cell.

FIGURES

A better understanding of the present invention can be obtained from the following detailed description in conjunction with the following drawings, in which:

FIG. 4 shows a first set of counter values for the improved SSD of FIG. 3;

FIG. 5 shows a second set of counter values for the improved SSD of FIG. 3;

FIG. 6 shows a third set of counter values for the improved SSD of FIG. 3;

DETAILED DESCRIPTION

Figure 1:
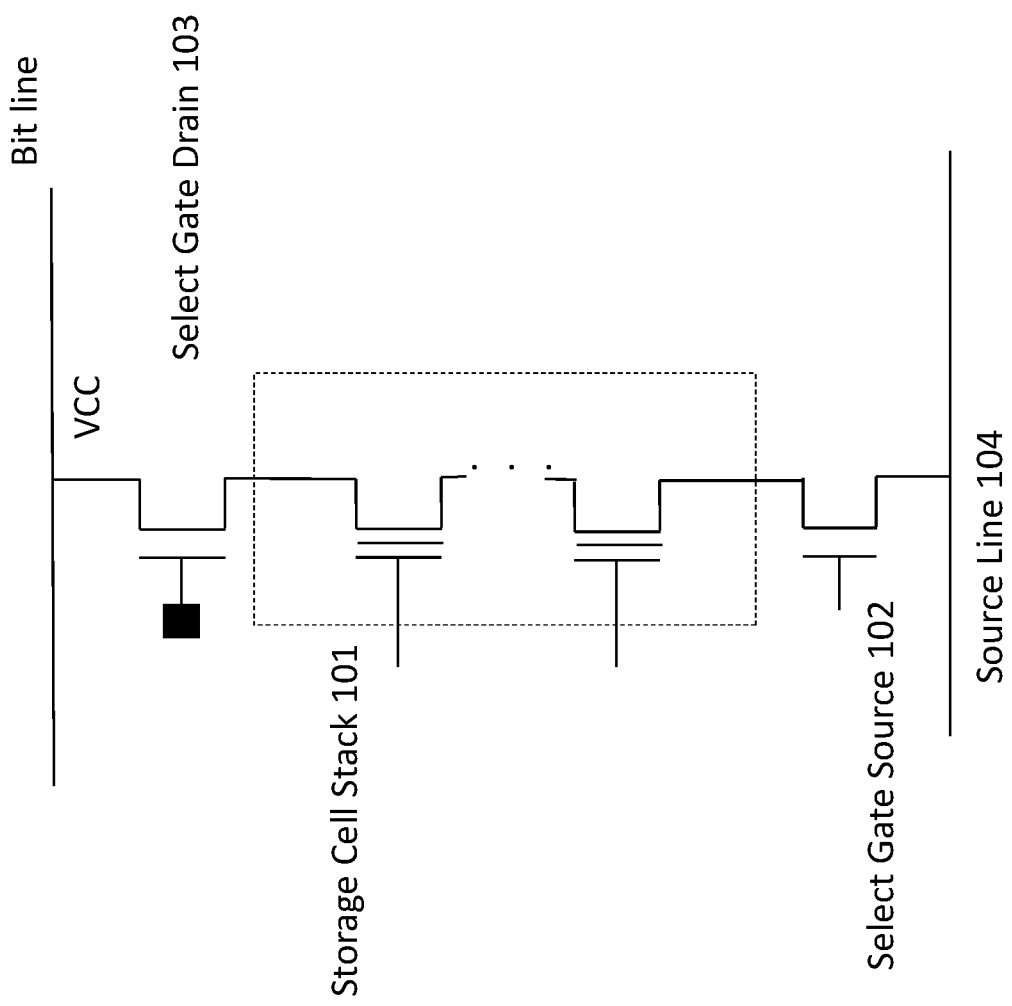
FIG. 1 shows circuit for a stacked storage cell.

FIG. 1 shows a prior art circuit schematic for the storage cell region of a three dimensional (3D) NAND FLASH memory. As observed in FIG. 1, the circuit includes a stack of NAND FLASH storage cells 101 coupled between a select gate source transistor 102 and a select gate drain transistor 103. The select gate source transistor 102 is coupled to a source line 104. The stack of storage cells 101 may be implemented as a three-dimensional stack of FLASH transistors that are monolithically integrated as a three dimensional storage array on a semiconductor chip along with the select gate source and select gate drain transistors 102, 103 as well as other transistor devices (not shown) that help implement the NAND function of the storage cell (e.g., sense amplifiers, row decoders, address decoders, etc.).

Figure 2A:
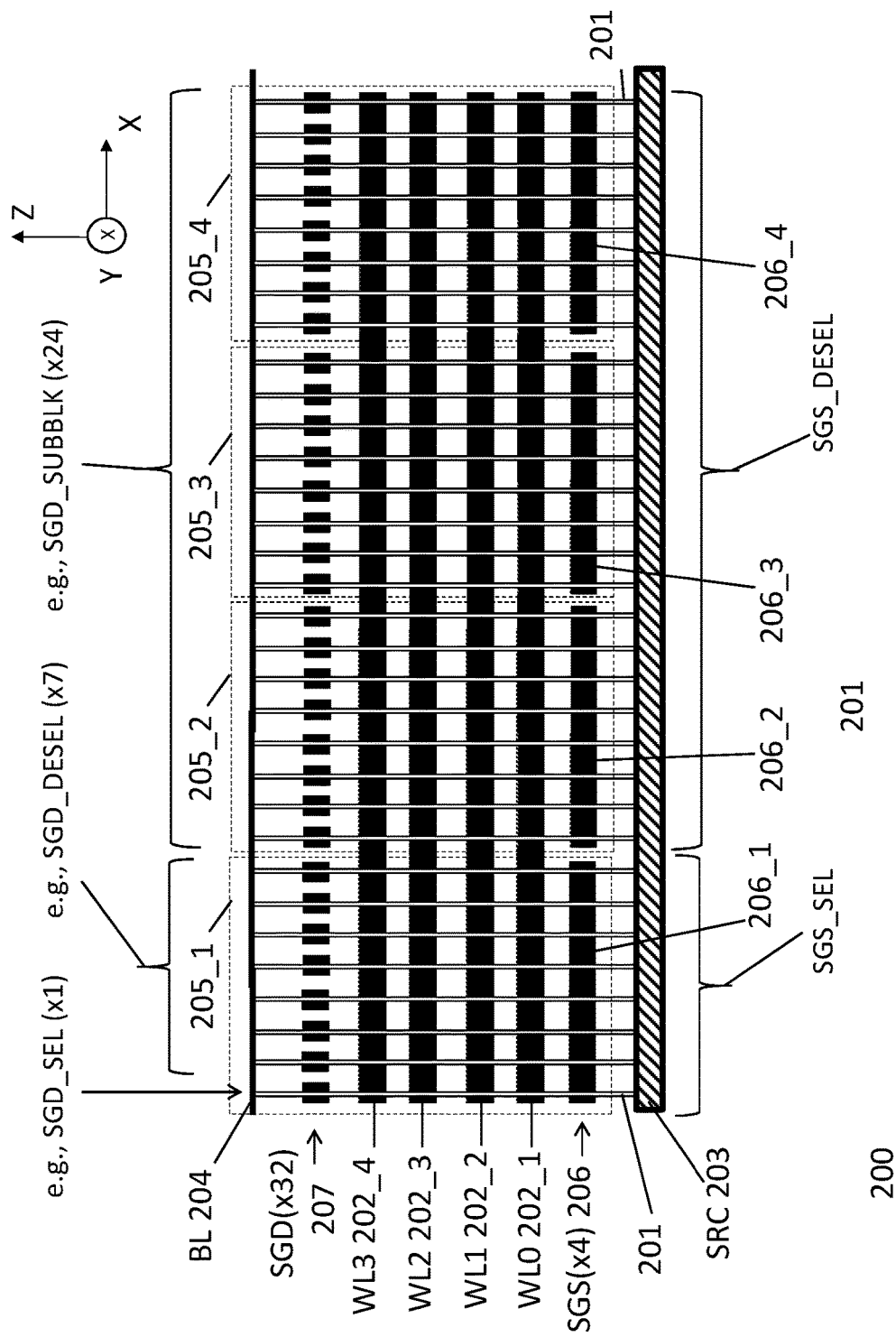
FIG. 2a shows a cross section of a block of storage cells.

FIG. 2a shows an exemplary embodiment 200 of the physical layout of a block (more generally, a storage cell array) of a three dimensional NAND FLASH memory chip. Here, a complete 3D NAND FLASH memory may comprise a plurality of such blocks (e.g., thousands of such blocks). For example, a different block may be accessed for each respective bit of a word of data that is written into or read from the memory. Alternatively or in combination, different (e.g., higher order) address bits that are provided to the memory may be decoded to activate different subsets of blocks within the overall memory.

As observed in FIG. 2a, the storage cell array block 200 includes a plurality of storage columns 201 that each contain a stack of storage cells (also referred to as a column or pillar) where each storage cell in a same stack corresponds to a different "level" of the stack (for drawing ease only the leftmost and rightmost stacks are labeled with reference number 201). Additionally, different levels of a stack are coupled to different respective word lines and the same stack level across multiple stacks is coupled to a same word line. In the particular embodiment of FIG. 2a, each storage column contains four storage cells/levels in its respective stack. As such, four different word lines 202_1 through 202_4 that each mark a different respective level of the stacks is coupled across the columns.

The physical layout of FIG. 2a shows that certain nodes of the generic storage cell design of FIG. 1 are shared within a block. For example, in the layout of FIG. 2a, all storage cell stacks in the block share the same word lines 202_1 through 202_4, source node 203 and bit-line 204.

Additionally, the block of FIG. 2a can be viewed as being composed of four different sub-blocks 205_1 through 205_4 where the columns of each respective sub-block share the same select gate source node. That is, in the embodiment of FIG. 2a, the columns of sub-block 205_1 share same select gate source node 206_1, the columns of sub-block 205_2 share same select gate source node 206_2, the columns of sub-block 205_3 share same select gate source node 206_3 and the columns of sub-block 205_4 share same select gate source node 206_4. In an embodiment, each stack includes its own respective select gate source transistor but the gate nodes of these transistors within a same sub-block are tied to the same select gate source node.

Other nodes of a storage cell stack, however, are not shared amongst the multiple storage cell stacks of the block. Besides the storage cells of the stacks themselves, note that each storage cell stack in the particular layout embodiment 200 of FIG. 2a has its own dedicated select gate drain node 207. That is, in an embodiment, each storage cell stack not only includes its own select gate drain transistor, but also, the respective gate node of each such select gate drain transistor is individually controlled/driven and is not tied to the gate node of any other select gate drain transistor within a same sub-block at least.

In order to access any particular storage cell within the block, such as a cell in the leftmost column in FIG. 2a as an example, the select gate source node 206_1 of the targeted cell's sub-block is activated (SGS_SEL in FIG. 2a) and the select gate source node of the other three sub-blocks in the block are deactivated (SGD_DESEL in FIG. 2a). Likewise, the respective select gate drain node of each storage column in the three unselected sub-blocks is deactivated (SGD_SUBBLK in FIG. 2a). Additionally, the select gate drain node of the targeted cell's storage column is activated (SGD_SEL in FIG. 2a) while all other select gate drain nodes in the block are deactivated (SGD_DESEL in FIG. 2a). Finally, the word line that is coupled to the targeted storage cell is activated while the other word lines are de-activated.

Note that the horizontal X axis of FIG. 2a runs parallel to bit line 204. A three dimensional NAND memory device extends the concept of a block beyond the two-dimensional perspective of FIG. 2a into a three-dimensional structure having a width that extends along the Y axis in a direction that is orthogonal to the bit lines. The logical concept of a "page" helps to define this additional block dimension.

Figure 2B:
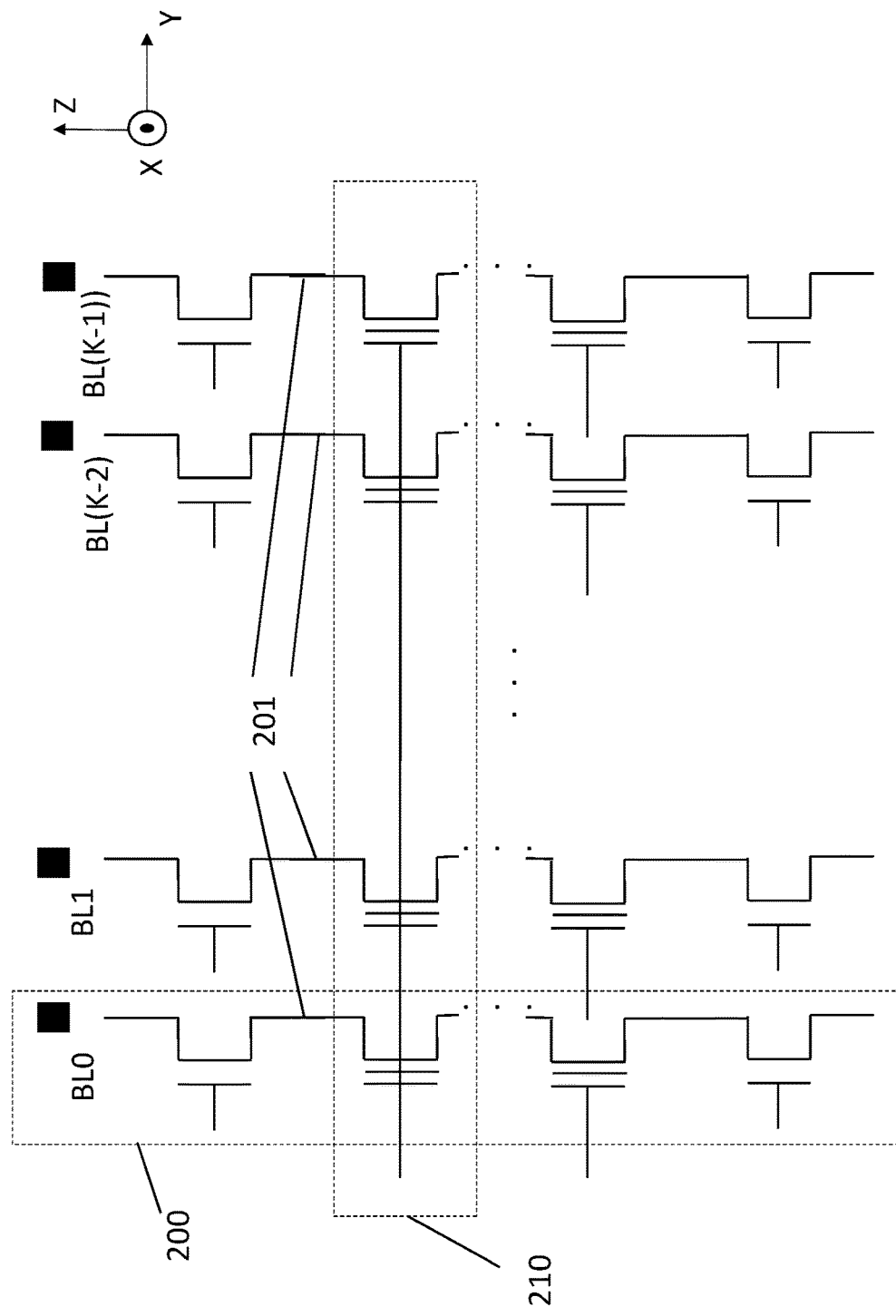
FIGS. 2b and 2c show pages stored by a storage cells.
Figure 2C:
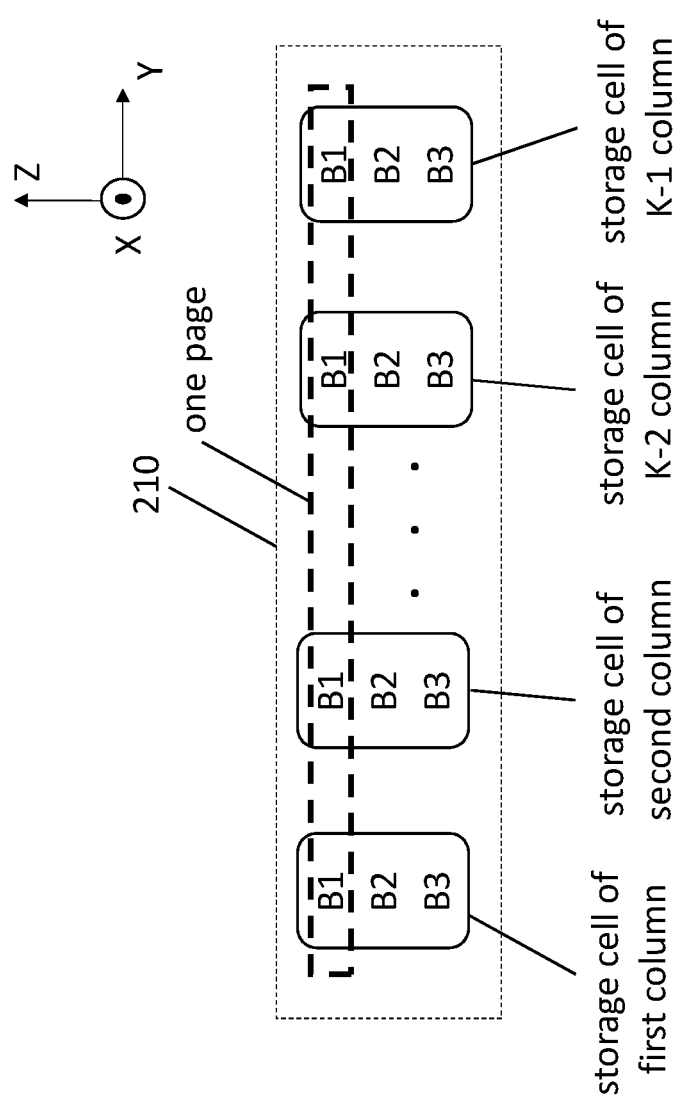

FIGS. 2b and 2c depict the concept of a logical page. Here, multiple storage cell columns 201 are observed in FIG. 2b along the Y axis. The cross sectional "slice" of a full block depicted in FIG. 2a is represented as slice 200 in FIG. 2b. For ease of drawing the SGD transistors are not shown in FIG. 2b but the block's bit lines BL0, BL1, etc. are depicted incrementing along the Y axis. As can be seen from the bit lines BL0 through BL(K−1), the block has a width along the Y axis of K columns.

According to the perspective of FIG. 2b, a "page" of data is formed from the storage cells that reside at a same stack level and extend along the Y axis (orthogonal to the bit lines). Thus, the data stored in the group 210 of storage cells observed in FIG. 2b corresponds to one or more pages of data. In the case where the 3D FLASH devices each store one bit of information there is only one page of data per stack level. Thus, for instance, if the storage cells of group 210 each only store one bit of data there is only one page of data stored by the cells of group 210.

The storage cells of more recent FLASH memory technologies, however, are designed to store more than one bit. For example, in the case of triple level cell (TLC) FLASH technology, each FLASH storage cell stores three bits of data. Referring to FIG. 2c, if the FLASH devices of FIG. 2b are implemented as TLC cells, there are three pages of data stored per level. Here, as observed in FIG. 2c, each FLASH device can be viewed as storing an upper bit B1, a middle bit B2 and a lower bit B3 (in reality each of the FLASH devices store one of eight different voltage levels each of which correspond to a specific B1, B2, B3 bit pattern). As such, the same, group of storage cells 210 of FIG. 2b would keep 3 pages of information: 1) a first page composed of the B1 bits, 2) a second page composed of the B2 bits; and, 3) a third page composed of the B3 bits.

Figure 2D:
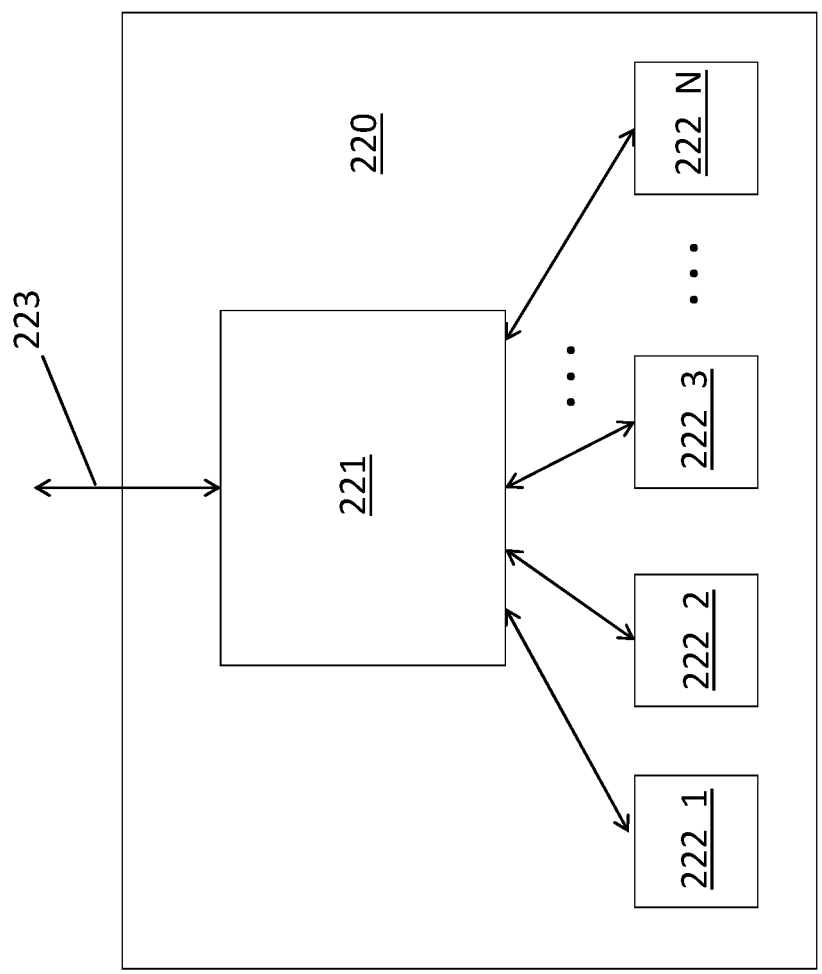
FIG. 2d shows a solid state drive (SSD)

FIG. 2d shows an embodiment of a solid state drive (SSD) 220 that includes multiple, discrete stacked storage cell 3D NAND FLASH memory chips 222_1 through 222_N. The SSD 220 also includes a control function 221 that implements the functions and operations performed by the SSD 200. Here, the control function 221 may be implemented with controller circuitry that is implemented as a controller or processor that executes firmware program code, dedicated hardware logic circuitry (e.g., hardwired logic circuitry (e.g., application specific integrated circuit (ASIC)) and/or programmable logic circuitry (e.g., Field Programmable Gate Array (FPGA), programmable logic device (PLD), programmable logic array (PLA))), or, that executes control functions with a combination of program code execution and hardware logic circuitry. Any program code that is executed by the control function 221 may be locally stored in non volatile storage resources of the SSD. The SSD also includes a host interface 223 such as a Peripheral Component Interconnect Express (PCIe) link, SAS (Serial Attached SCSI (Small Computer System Interface) controller, Serial ATA (SATA) controller, Fibre Channel or other form of interconnect (e.g., for connection to a host platform).

One of the responsibilities of the control function 221 is the implementation of wear-leveling. As is known in the art, FLASH devices can "wear out" (their ability to keep data becomes unreliable) if they are accessed too frequently. As such, the control function 221 implements a special algorithm that monitors how often each of the storage cell blocks within each 3D FLASH chip 222 are being accessed, and, "swaps" the data content of a more frequently accessed block with the data content of a less frequently used block. By so doing, the reliability of the storage cells of the block that was storing the more frequently accessed data is preserved because, after the swap, they will be storing less frequently accessed data.

Traditionally, the control function 221 has maintained a counter for each block within each 3D FLASH chip 222 that increments each time its corresponding block is read and/or written. Those blocks whose access counts surpass a first threshold are marked as candidate blocks whose data should be swapped out for wear leveling purposes. Those blocks whose access counts remain beneath a second threshold are marked as candidate blocks for receiving data from blocks whose counts surpass the first threshold. During an actual wear leveling swap, a blocks whose count is below the second threshold has its less frequently accessed data moved into a block whose access count has surpassed the first threshold.

Another data reliability problem, referred to as "word line read disturb", results from a word line being accessed too frequently for read operations. Here, referring briefly back to the exemplary block structure of FIG. 2a, recall that four word lines 202_1 through 202_4 were depicted. When a word line, such as any of word lines 202_1 through 202_4 in the exemplary structure of FIG. 2a, is activated for a read operation one or more storage cells that are directly connected to the word line are accessed. Unfortunately, the access induces, e.g., high energy fields and/or voltage potentials, in and/or around certain storage cells that are proximate to the accessed storage cell(s). In cases where a particular word line is activated for read operations too frequently, such proximate storage cells can have their stored data corrupted (one or more bits of the proximate storage cells can be flipped (a "1" changes to a "0" and/or a "0" changes to a "1").

Unfortunately, preventing word line read disturb errors by way of the aforementioned block based access count mechanism described just above is becoming increasingly unfeasible. Specifically, traditionally, word line read disturb error rates correlated fairly tightly with uniform block errors rates induced from other kinds of block accesses. As a consequence, block access count based wear leveling is sufficient to also predict/avoid word line read disturb errors for older memory technologies. With, e.g., the smaller feature sizes of current leading edge 3D FLASH technologies, however, word line read disturb error rates are becoming multiple factors higher than uniform block errors rates (e.g., 16 times higher, 128 times higher, etc.). As such, a finer grained access counting mechanism that includes, e.g., some kind of word line access counting mechanism is warranted.

Because pages of information are recognized/understood by the control function 221, one approach for counting word line accesses is to keep a counter for each page that is stored in each of the 3D FLASH chips 222. In this case, whenever a specific page is accessed for a read operation, its specific counter is incremented. Unfortunately, this approach is not feasible because the number of different counters that would need to be maintained by the control function 221 is very large which, in turn, would devote too much of the control function's memory resources to the different counter values.

For example, referring briefly back to FIG. 2a, at least one page counter would be kept for every observed crossing point between a word line and a column. As there are 32 observed columns and 4 observed word lines in FIG. 2a, at least 128 unique counters would need to be maintained for the block of FIG. 2a. The block design of FIG. 2a is only exemplary in that current, actual FLASH memory block designs typically include thousands of unique word line and column crossings. As there are typically thousands of blocks per FLASH chip, perhaps multiple millions of unique counters would need to be maintained for an SSD.

Thus, in order to reduce the sheer number of counters, another approach is to use two counters: 1) a first counter of the form [die_ID; block_ID]; and, 2) a second counter of the form [block_ID; SGS-WL_ID]. Here, for the first counter, die_ID is used to identify a particular one of the 3D FLASH chips 222_1 through 222_N in the SSD and block_ID is used to identify a particular block within the chip identified by the die_ID. By contrast, for the second counter, block_ID corresponds to a particular block within all of the SSD's FLASH chips 222 (also referred to as a "macroblock") and SGS-WL_ID identifies a particular segment of a word line within the set of blocks identified by the block_ID whose respective storage cell stacks are tied to a same SGS node (also referred to an "SGS-WL segment").

As there are thousands of blocks per FLASH device, the number of counters of the first type (hereinafter referred to as "per block counters") should only be in the range of tens of thousands or less for SSD's having tens of FLASH chips or less. Furthermore, as there are typically no more than hundreds of different SGS-WL segments within a block and no more than thousands of blocks per FLASH chip, the number of counters of the second form (hereinafter referred to as "SGS-WL segment counters") should be in the range of hundreds of thousands or less. Thus, the number of counters is dramatically reduced as compared to an approach that tracks access counters for each page in the SSD.

Figure 3:
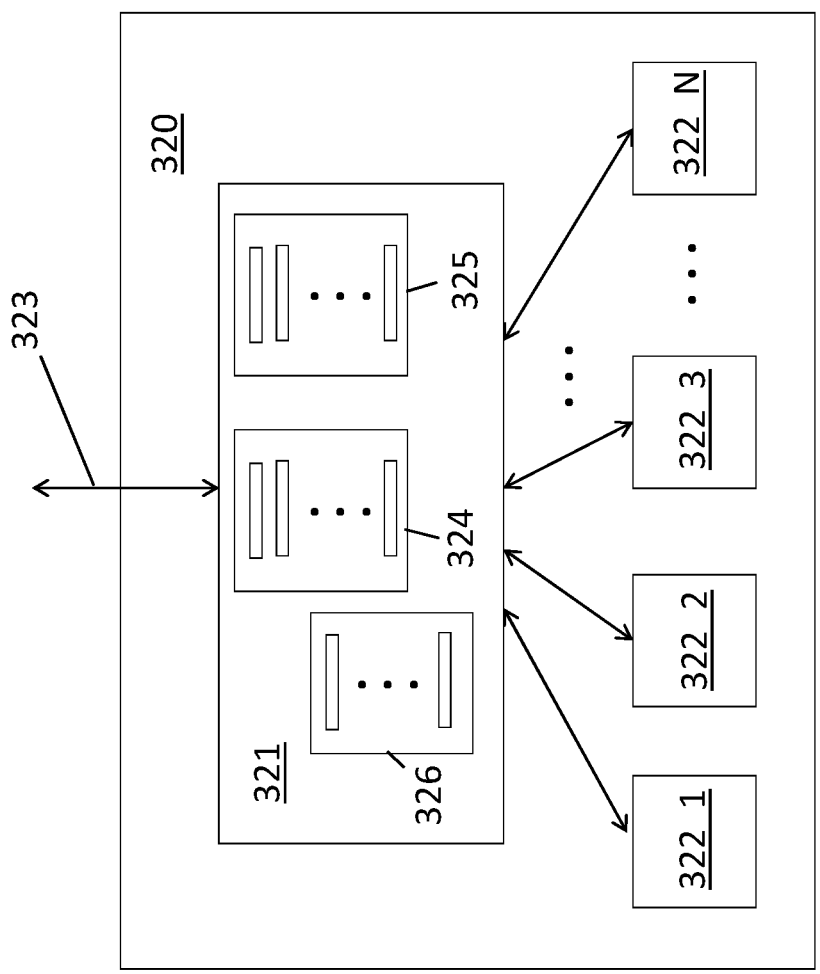
FIG. 3 shows an improved SSD.

FIG. 3 therefore shows an improved SSD 320 that includes a control function 321, FLASH chips 322 and interface 323 as described above with respect to FIG. 2d. The control function 321 of the SSD 320 of FIG. 3, however, has been further enhanced to maintain per block counters 324 and SGS-WL segment counters 325 as described just above. The enhanced control function 321 also implements new wear leveling processes in view of the state of these counters 324, 325 as described immediately below. The control function 321 includes controller circuitry that has been enhanced to implement the counters and perform the new wear leveling processes.

The per block counters 324 provide a read access count for each block in the SSD and are akin to the counters used by traditional SSDs in that there are separate counters for each block within each die in the SSD. The SGS-WL counters 325 provide a respective read access count for different SGS-WL segments across all the dies in the SSD and are particularly insightful into the prediction of word line read disturb errors.

Referring briefly back to FIG. 2a, read line disturb errors have been observed to be particularly dependent on SGS node coupling. That is, if a read access to a particular storage cell is going to cause a disturb error within another storage cell, there is a higher likelihood that the accessed storage cell and the disturbed storage cell are coupled to a same SGS node (e.g., if the accessed storage cell and the disturbed storage cell are located on the same column they share the same SGS transistor, or, if the storage cell and the disturbed storage cell are located on different columns, there is a higher probability that the gate nodes of their respective SGS transistors are tied to the same SGS node).

For the particular block embodiment of FIG. 2a, each observed sub group 205_1, 205_2, 205_3, 205_4 is defined by the columns that are tied to a same SGS node. That is, the columns of sub group 205_1 are tied to SGS node 206_1, the columns of sub group 205_2 are tied to SGS node 206_2, the columns of sub group 205_3 are tied to SGS node 206_3, and the columns of sub group 205_4 are tied to SGS node 206_4.

The SGS-WL_ID notation of the SGS-WL counters indicates that there is a separate counter reserved for each unique combination of word line and group of columns, across all the FLASH chips in the SSD, that are tied to a same SGS node. As such there are 16 different counters maintained for the block structure of FIG. 2a. That is, there is one WL3 counter for each of sub-groups 205_1, 205_2, 205_3 and 205_4 (four counters for WL3 total), there is one WL2 counter for each of sub-groups 205_1, 205_2, 205_3 and 205_4 (four counters for WL2 total), there is one WL1 counter for each of sub-groups 205_1, 205_2, 205_3 and 205_4 (four counters for WL1 total) and there is one WL0 counter for each of sub-groups 205_1, 205_2, 205_3 and 205_4 (four counters for WL0 total). As there are 16 counters per block for this exemplary block, the total number of SGS-WL counters would be 16×M where M is the number of blocks per FLASH chip (a unique SGS-WL counter is kept for each SGS-WL segment across all blocks in a FLASH chip).

Active avoidance of read disturb errors within the SSD can be achieved by observing the state of the per block and SGS-WL counters 324, 325 and implementing specific wear level routines in response. Examples are described immediately below. Here, the control function 321 also includes threshold settings 326, are parameters that, e.g., are stored in the SSD's non volatile storage and/or, e.g., Basic Input/Output System (BIOS) firmware non volatile storage of the SSD's host platform and loaded into the control function during bring up and/or power-on-reset of the SSD. The control function 321 determines when triggering a wear leveling data swap is appropriate by repeatedly comparing the current state of counters 324 and 325 to the threshold settings 326 (or calculations made from them).

1. Per Block Threshold and Block Wear Leveling. The per block threshold is a first threshold setting and is repeatedly compared against each of the per block counter values 324. If the value of any one of the per block counters 325 surpasses the per block threshold, that data contained by that counter's corresponding block is swapped with the data of another block within the SSD 320 whose corresponding per block counter is, e.g., especially low (e.g., beneath some second threshold).

2. Per SGS-WL Segment Threshold and SGS-WL Segment Wear Leveling. The per SGS-WL segment threshold can be used to detect when a particular SGS-WL segment of a block has received a sufficient number of read accesses to justify the swapping of the segment's pages with the pages of another SGS-WL segment that has received a relatively low number of read accesses.

In an embodiment, because SGS-WL counter values for a particular SGS-WL segment are accumulated across multiple chips of an SSD, an e.g., empirically determined count threshold for the SGS-WL segment of a single chip is scaled upward depending on how evenly or unevenly read accesses to a particular SGS-WL segment is distributed across the dies of the SSD. As such, in various embodiments, the control function 321 is provided the single die SGS-WL segment threshold as one of thresholds 326. The wear leveling algorithms executed by the control function 321 then dynamically adjust/determine the thresholds that trigger wear leveling swaps for individual SGS-WL segments based on the count state of the SGS-WL segment counters 326 and the per block counters 325. Here, the per block counters 325 add insight into usage patterns within the SSD 320 that can be used to refine the thresholds for specific SGS-WL segments. FIGS. 4 through 7 demonstrate some examples.

Consider an example where the empirically determined single die SGS-WL segment threshold corresponds to 3,000 read accesses for word line read disturb errors. Consider further an SSD having four FLASH chips in the SSD (N=4 in FIG. 3). If the SGS-WL segment counter values and the per block counter values together indicate that the read accesses to a particular SGS-WL segment are being evenly distributed across all the dies of the SSD, then, the SSD can set a wear leveling threshold for the SGS-WL segment that is equal to the empirically determined single die SGS-WL segment threshold multiplied by the number of die within the SSD. Thus, for SGS-WL segments that meet this environmental condition, wear leveling can be triggered if their corresponding SGS-WL segment counter value reaches a value of 12,000(3,000×4=12,000).

FIG. 4 shows an exemplary state for per the block counter values 401 of a particular block within each of the four die having block_ID=300. As can be seen, read accesses to the block having block_ID=300 are evenly distributed across the four FLASH chips in the SSD. FIG. 4 also shows exemplary SGS-WL segment counter states 402 that are tabulated concurrently with the counter per block counter values 401. Here, the first column 403 identifies a particular block across all of the FLASH chips, the second column 404 identifies the different SGS-WL segments within each corresponding block and the third column tabulates the segment's respective access counts (e.g., read counts).

In the depicted SGS-WL segment counter values 402, the second column 404 is aligned with the exemplary block design of FIG. 2a. As such, there are 16 different entries (00 through 15) for each entry of the first column 411. Again, actual current FLASH memory chips may have hundreds of second column entries per first column entry. The observed access counts in the third column 405 are the total across all FLASH chips within the SSD. As can be observed from the exemplary SGS-WL counter data 402, SGS-WL segment 00 has received a total of 11,940 reads across all of the chips in the SSD whereas all other SGS-WL segments have received only one read access apiece.

From the SGS-WL segment counters 402 it is clear that SGS-WL segment 00 is receiving the vast majority of read accesses that are made to blocks having ID=300 across all four chips. This means the total per block counts for block 300 observed in the read block counters 401 are approximately tallies of the SGS-WL segment 00 by itself. Viewing the counts 401, 402 in this manner it is clear that the accesses to SGS-WL segment 00 are being evenly distributed across the dies. As such, the SGS-WL segment counter threshold for SGS-WL segment 00 sufficient to trigger page data swapping of SGS-WL segment 00 within each of the four die should be set at the single chip threshold times the number of chips in the SSD (e.g., 3,000×4=12,000).

If the per block counter state 501 of FIG. 5 existed instead of the first counter state 401 of FIG. 4 and if the SGS-WL segment counter state 502 of FIG. 5 existed instead of the SGS-WL segment counter state 402 of FIG. 4, the decision to swap the pages of SGS-WL segment 00 should be made at a much lower threshold than 12,000 and should only affect SGS-WL segment 00 within one of the dies rather than in all four of the dies.

Referring to the per block counter state 501, it is clear that die 0 is receiving the vast majority of accesses to block 300. In this case, the decision to swap the pages of SGS-WL segment 00 could be made at a SGS-WL segment counter value that is equal to the single die threshold (3,000) especially since all other SGS-WL segments within block 300 continue to show little/no access. That is, combining the information from both counter value tables 501 and 502, it is clear that SGS-WL segment 00 of block 300 of die 0 has received all 2,999 accesses to block 300 of die 0. Therefore, the threshold for the SGS-WL segment counter value that triggers the swapping of the pages of SGS-WL segment 00 should be set at 3,000 instead of 12,000 and should only affect SGS-WL segment 00 within die 0. Thus, whereas the scenario of FIG. 4 triggers the page swapping for multiple physical SGS-WL segments, by contrast, the scenario of FIG. 5 causes the swapping of the pages for only one physical SGS-WL segment.

Other scenarios that result in SGS-WL counter thresholds that reside somewhere between the extremes of FIGS. 4 and 5 can also be handled. FIG. 6 shows SGS-WL segment counter states 602 for another scenario where SGS-WL segment 00 continues to receive substantially all the accesses to block 300 across all the dies in the SSD. However, from the per block counter states 601, these accesses are split across two of the die within the SSD. In this case, the appropriate SGS-WL segment counter threshold for SGS-WL segment 00 is twice the single die threshold (2×3,000=6,000) since it is clear that only until the SGS-WL segment counter for segment 00 reaches a value of 6,000 will any particular one of the segments on any particular one of the two die receive 3,000 accesses. If/when the SGS-WL counter for segment 00 reaches 6,000, the pages of SGS-SL segment 00 should only be swapped for die 0 and 1 and not for die 2 and 3.

With respect to the aforementioned page swapping, when the storage cells along a particular SGS-WL are swapped out, all of the pages contained by each of the cells is swapped out. Thus, for instance, in the case of TLC FLASH technology, three pages are swapped out per cell.

The above description has focused on addressing read disturb errors for the exemplary block structure of FIG. 2a where a word line acts as the disturber wire for a segment of proximate cells that are connected to a same select gate source node, and where, finer grained access counts are desirable but are ultimately limited by the number of counters that can practicably be tracked. A solution as explained in the preceding discussion is to introduce a counter structure that maintains counts for individual segments of storage cells within a memory device where the cells within each particular segment can be disturbed by a particular disturber node/wire (a specific word line) and are coupled to a same node (a specific select gate source node). The storage device maintains counts of accesses (e.g., reads) to each such segment across multiple die. Here, maintaining access counts for each particular segment introduces finer granularity in that specific cells at risk of being disturbed can be more precisely identified prior to their exhibiting actual disturbance. At the same time, maintaining counts for segments of cells and/or segments of cells across multiple die limits the granularity so that the total number of counters is practicable.

It is pertinent to point out that the same general approach can potentially also be applied to memory structures that are entirely different than the exemplary memory device structure of FIG. 2a. That is, the general approach can potentially be applied to any memory device structure where a particular wire (e.g., other than a word line) acts as a disturber to a segment of proximate cells that are coupled to a same node (e.g., other than a select gate source node). Examples include 3D FLASH devices having structures different than those observed in FIG. 2a and/or emerging non volatile memory technologies such as, to name a few possibilities, phase change based memories, three dimensional crosspoint memory technology memories, "write-in-place" non volatile main memory devices, memory devices that include chalcogenide in their respective storage cells, a ferro-electric based memory (e.g., FeRAM), a magnetic based memory (e.g., MRAM), a spin transfer torque based memory (e.g., STT-RAM), a resistor based memory (e.g., Re RAM), a Memristor based memory, universal memory, Ge2Sb2Te5 memory, programmable metallization cell memory, amorphous cell memory, Ovshinsky memory, etc.

Figure 7:
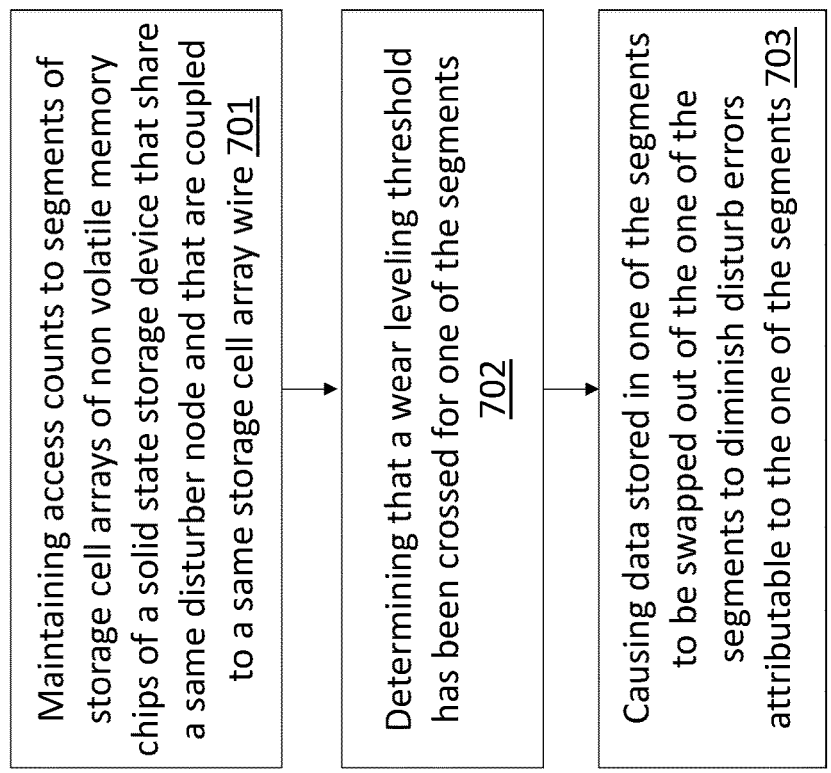
FIG. 7 shows a method performed by the SSD of FIG. 3.

FIG. 7 shows a method described above. The method includes maintaining 701 access counts to segments of storage cell arrays of non volatile memory chips of a solid state storage device that share a same disturber node and that are coupled to a same storage cell array wire. The method includes determining 702 that a wear leveling threshold has been crossed for one of the segments. The method also includes causing 703 data stored in the one of said segments to be swapped out of the one of the segments to diminish disturb errors attributable to the one of said segments.

Figure 8:
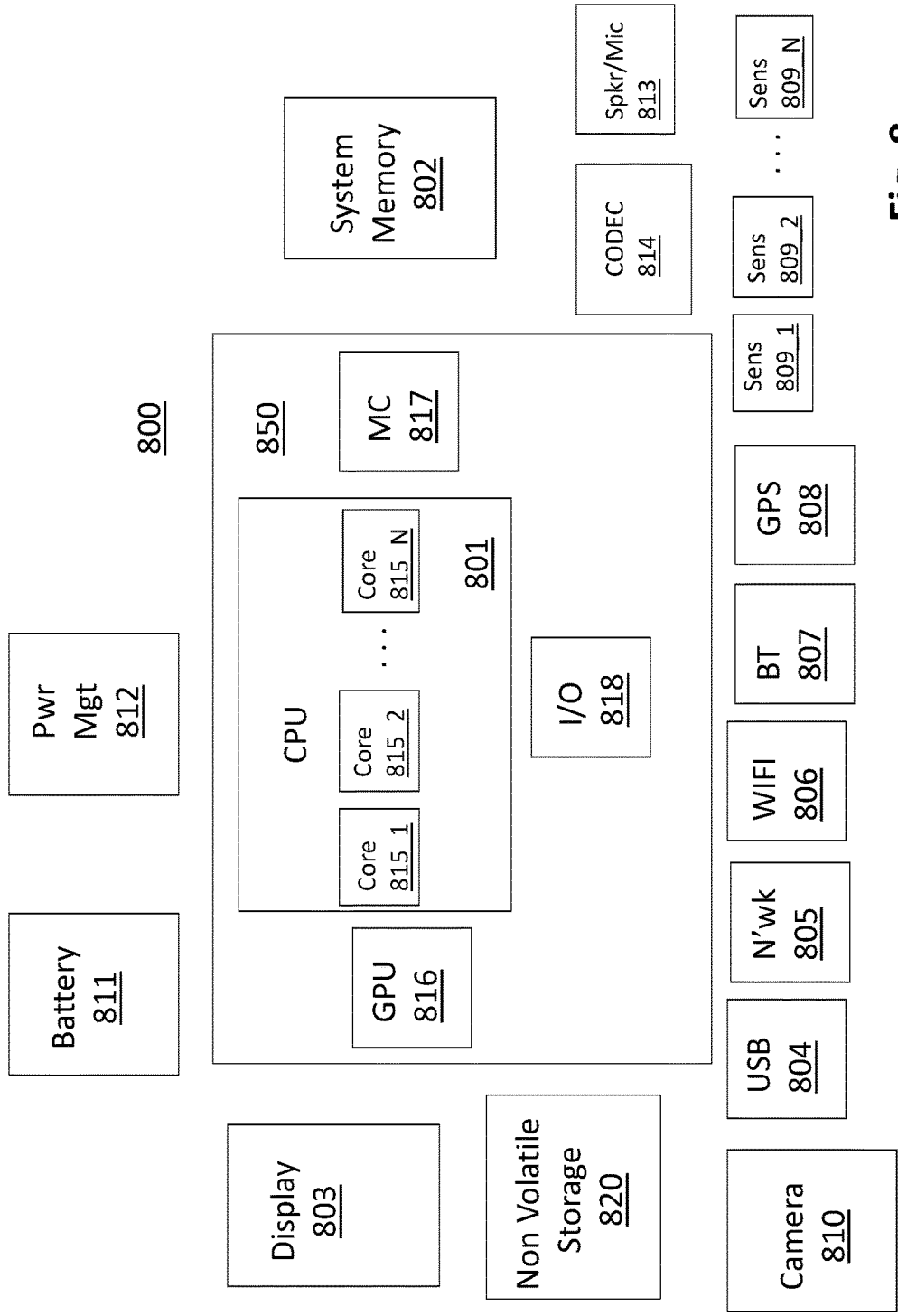
FIG. 8 shows a computing system.

FIG. 8 shows a depiction of an exemplary computing system 800 such as a personal computing system (e.g., desktop or laptop) or a mobile or handheld computing system such as a tablet device or smartphone, or, a larger computing system such as a server computing system.

As observed in FIG. 8, the basic computing system may include a central processing unit 801 (which may include, e.g., a plurality of general purpose processing cores and a main memory controller disposed on an applications processor or multi-core processor), system memory 802, a display 803 (e.g., touchscreen, flat-panel), a local wired point-to-point link (e.g., USB) interface 804, various network I/O functions 805 (such as an Ethernet interface and/or cellular modem subsystem), a wireless local area network (e.g., WiFi) interface 806, a wireless point-to-point link (e.g., Bluetooth) interface 807 and a Global Positioning System interface 808, various sensors 809_1 through 809_N (e.g., one or more of a gyroscope, an accelerometer, a magnetometer, a temperature sensor, a pressure sensor, a humidity sensor, etc.), a camera 810, a battery 811, a power management control unit 812, a speaker and microphone 813 and an audio coder/decoder 814.

An applications processor or multi-core processor 850 may include one or more general purpose processing cores 815 within its CPU 801, one or more graphical processing units 816, a memory management function 817 (e.g., a memory controller) and an I/O control function 818. The general purpose processing cores 815 typically execute the operating system and application software of the computing system. The graphics processing units 816 typically execute graphics intensive functions to, e.g., generate graphics information that is presented on the display 803. The memory control function 817, which may be referred to as a main memory controller or system memory controller, interfaces with the system memory 802. The system memory 802 may be a multi-level system memory.

Each of the touchscreen display 803, the communication interfaces 804-807, the GPS interface 808, the sensors 809, the camera 810, and the speaker/microphone codec 813, 814 all can be viewed as various forms of I/O (input and/or output) relative to the overall computing system including, where appropriate, an integrated peripheral device as well (e.g., the camera 810). Depending on implementation, various ones of these I/O components may be integrated on the applications processor/multi-core processor 850 or may be located off the die or outside the package of the applications processor/multi-core processor 850. Non volatile storage 820 may include non volatile mass storage which may include one or more SSDs having 3D NAND FLASH and dual counters to implement fine grained wear leveling as described at length above. Non volatile storage 820 may hold the BIOS and/or firmware of the computing system.

One or more various signal wires within the computing system, e.g., a data or address wire of a memory bus that couples the main memory controller to the system memory, may include a receiver that is implemented as decision feedback equalizer circuit that internally compensates for changes in electron mobility as described above.

Embodiments of the invention may include various processes as set forth above. The processes may be embodied in machine-executable instructions. The instructions can be used to cause a general-purpose or special-purpose processor to perform certain processes. Alternatively, these processes may be performed by specific hardware components that contain hardwired logic for performing the processes, or by any combination of programmed computer components and custom hardware components.

Elements of the present invention may also be provided as a machine-readable medium for storing the machine-executable instructions. The machine-readable medium may include, but is not limited to, floppy diskettes, optical disks, CD-ROMs, and magneto-optical disks, FLASH memory, ROMs, RAMs, EPROMs, EEPROMs, magnetic or optical cards, propagation media or other type of media/machine-readable medium suitable for storing electronic instructions. For example, the present invention may be downloaded as a computer program which may be transferred from a remote computer (e.g., a server) to a requesting computer (e.g., a client) by way of data signals embodied in a carrier wave or other propagation medium via a communication link (e.g., a modem or network connection).

The invention claimed is:

1. An apparatus, comprising:
a solid state drive comprising multiple three dimensional stacked FLASH memory chips and controller circuitry, said controller circuitry to implement wear leveling of storage cells of said FLASH memory chips at a granularity of segments of blocks of said FLASH memory chips that are coupled to a same word line and source gate source node to diminish word line read disturb errors, wherein said controller circuitry is to maintain first access counts to blocks of each of said FLASH memory chips and second access counts to said segments.

2. The apparatus of claim 1 wherein said second access counts comprise counts for a same word line and source gate source combination across all of said FLASH memory chips.

3. The apparatus of claim 1 wherein said second access counts comprise separate counts for same word line and source gate combinations within a block for different blocks within said FLASH memory chips.

4. The apparatus of claim 1 wherein said controller circuitry is to adaptively adjust a wear leveling threshold trigger for one of said segments based on said first access counts and said second access counts.

5. The apparatus of claim 4 wherein said controller circuitry is to receive a pre-determined threshold value to be scaled in order to perform said adaptive adjustment of said wear leveling threshold trigger.

6. A computing system, comprising:

one or more processing cores;

a main memory;

a memory controller disposed between the main memory and the one or more processing cores;

a solid state drive comprising multiple three dimensional stacked FLASH memory chips and controller circuitry, said controller circuitry to implement wear leveling of storage cells at a granularity of segments of blocks of said FLASH memory chips that are coupled to a same word line and source gate source node to diminish word line read disturb errors, wherein said controller circuitry is to maintain first access counts to blocks of each of said FLASH memory chips and second access counts to said segments.

7. The computing system of claim 6 wherein said second access counts comprise counts for a same word line and source gate source combination across all of said FLASH memory chips.

8. The computing system of claim 6 wherein said second access counts comprise separate counts for same word line and source gate combinations within a block for different blocks within said FLASH memory chips.

9. The computing system of claim 6 wherein said controller circuitry is to adaptively adjust a wear leveling threshold trigger for one of said segments based on said first access counts and said second access counts.

10. The computing system of claim 9 wherein said controller circuitry is to receive a pre-determined threshold value to be scaled in order to perform said adaptive adjustment of said wear leveling threshold trigger.

11. The computing system of claim 6 wherein a single storage cell of the storage cells of the FLASH memory chips store more than one bit.

12. The computing system of claim 6 wherein the wear leveling comprises swapping out multiple pages per storage cell location of a segment that the controller circuitry has decided to swap out data of.

* * * * *